US010402390B1

(12) United States Patent
Shay et al.

(10) Patent No.: US 10,402,390 B1
(45) Date of Patent: Sep. 3, 2019

(54) MODEL VALIDATION SYSTEM

(71) Applicant: Workday, Inc., Pleasanton, CA (US)

(72) Inventors: Bruce Shay, San Leandro, CA (US); Ken Pugsley, Kansas City, MO (US); Tom Evans, Walnut Creek, CA (US)

(73) Assignee: Workday, Inc., Pleasanton, CA (US)

(*) Notice: Subject to any disclaimer, the term of this patent is extended or adjusted under 35 U.S.C. 154(b) by 613 days.

(21) Appl. No.: 14/620,118

(22) Filed: Feb. 11, 2015

(51) Int. Cl.
*G06F 16/23* (2019.01)
*G06F 17/50* (2006.01)

(52) U.S. Cl.
CPC .......... *G06F 16/2365* (2019.01); *G06F 17/50* (2013.01)

(58) Field of Classification Search
CPC . G06F 17/30371; G06F 17/50; G06F 16/2365
USPC .......................................................... 707/702
See application file for complete search history.

(56) References Cited

U.S. PATENT DOCUMENTS 7,137,100 B2 * 11/2006 Iborra ...................... G06F 8/30 717/106
7,334,216 B2 * 2/2008 Molina-Moreno ....... G06F 8/35 717/105
2003/0023413 A1 * 1/2003 Srinivasa ................ G06F 17/50 703/2
2011/0224954 A1 * 9/2011 Jayasundara ....... G06F 17/5009 703/1
2012/0054590 A1 * 3/2012 Oh ........................ G06F 17/246 715/212

* cited by examiner

*Primary Examiner* — Hosain T Alam
*Assistant Examiner* — Saba Ahmed
(74) *Attorney, Agent, or Firm* — Van Pelt, Yi & James LLP

(57) ABSTRACT

A system for model validation comprises an input interface, a model builder, a model validator, a model committer, and an attachment point. The input interface is for receiving a set of input data, wherein a first input data of the set of input data is associated with a first model level validation and a first attachment point. The model builder is for determining a model that is used to update a database based at least in part on the set of input data. The model validator is for determining whether the model is valid using model validations, wherein the model validations include the first model level validation. The model committer is for committing the model in the event the model is valid. The attachment point determiner is for determining a failure associated attachment point in the event the model is not valid, wherein the failure associated attachment point comprises the first attachment point in the event that the first model level validation failed.

18 Claims, 7 Drawing Sheets

MODEL VALIDATION SYSTEM

BACKGROUND OF THE INVENTION

An enterprise software system including an object-based database is required to maintain the database in a valid state. Typically, when data is input to the database, it is checked after it is received to ensure adding it will result in the database state remaining valid. After the data is checked, it is processed to create an object model, and the object model is added to the object-based database. However, in the event that input arrives via multiple input interfaces, multiple checks have to be coded and performed. The multiple checks may not be consistent with each other leading to errors when the data is entered into the model.

BRIEF DESCRIPTION OF THE DRAWINGS

Various embodiments of the invention are disclosed in the following detailed description and the accompanying drawings.

DETAILED DESCRIPTION

Figure 1:
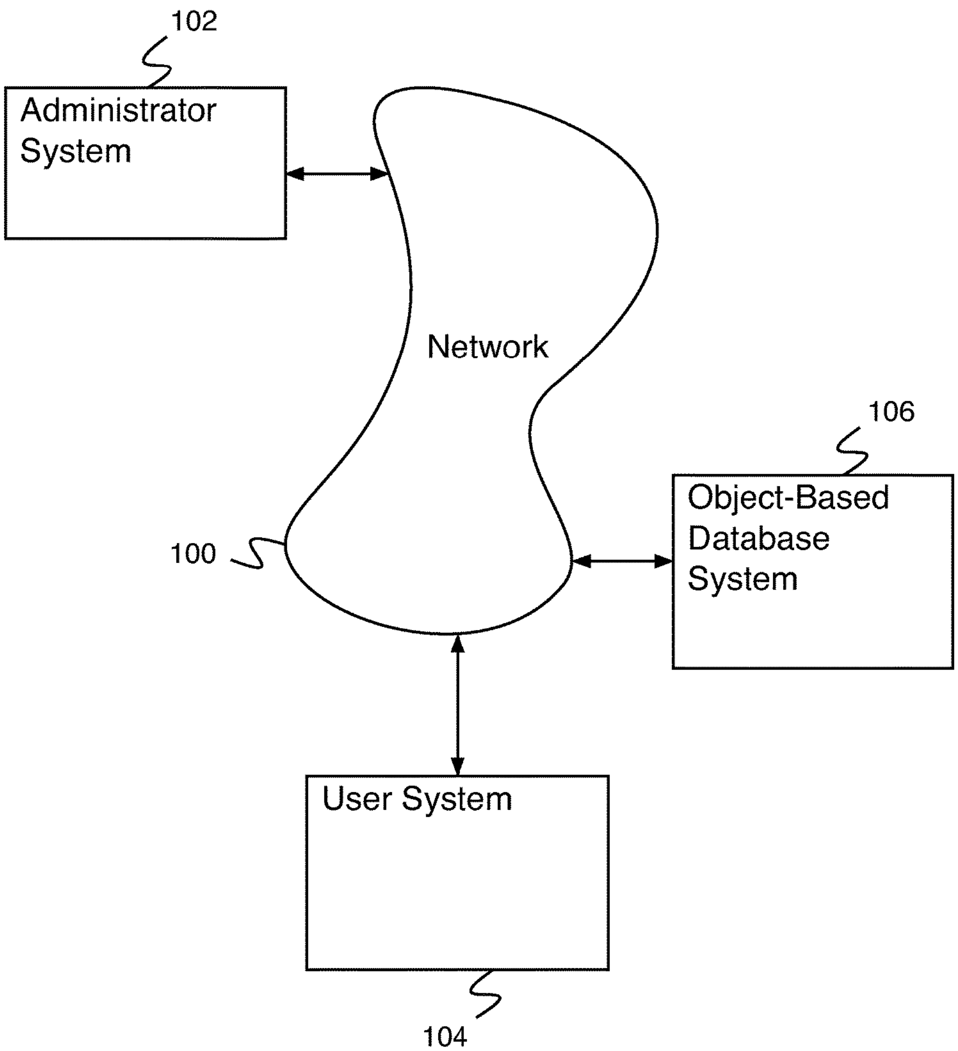
FIG. 1 is a block diagram illustrating an embodiment of a network system.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term ‘processor’ refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A system for model level validation is disclosed. The system for model level validation comprises an input interface, a model builder, a model validator, a model committer, and an attachment point determiner. The input interface is for receiving a set of input data, wherein a first input data of the set of input data is associated with a first attachment point. The model builder is for determining a model that is used to update a database based at least in part on the set of input data. The model validator is for determining whether the model is valid using model level validations. The model committer is for committing the model in the event the model is valid. The attachment point determiner is for determining a failure associated attachment point based at least in part on the check in the event the model is not valid.

In some embodiments, the attachment point determiner is combined with, or a part of, the model validator. In some embodiments, the model validator handles tracking information that enables tracing back to an associated input field (e.g., using an attachment point) in the event that there is an error detected on checking a data that is part of a model (e.g., a model level validation failure).

In some embodiments, a system for model level validation comprises a set of validity checks on data. An object-based database system receives data via a user interface. The user interface comprises a set of interfaces for interacting with users in different ways. The data is built into an object model to be added to the object-based database system. The object model comprises a set of objects. Each object includes object data, object methods, and interconnections to other objects. Input data is stored in the object model as object data. Interconnections are present between objects of the object model as well as between objects of the object model and objects already present in the object database. When the object model is built, interconnections to objects already in the object database are indicated as temporary. The object model is then validated for correctness. For example, data in the object model is checked for validity (e.g., out of range data, incorrectly typed data, inconsistent data, etc.). In the event the object model is determined to be correct, it is committed to the database, and interconnections to objects in the object database are made permanent. In the event the object model is determined not to be correct, the object model is discarded. In some embodiments, an indication is provided to a user describing the input field determined to be responsible for the object model not being correct (e.g., the input field into which incorrect data was entered). In order to facilitate determination of the input field responsible for the object model not being correct, one or more attachments point is/are associated with one or more input fields of the user interface. In some embodiments, the attachment point comprises an identifier uniquely identifying the input field or the type of input field (e.g., a first name). When the object model is built, an attachment point associated with an input field is further associated with any object data values depending on the input field. In the event that the object model is determined to be invalid, the object model is analyzed by an attachment point determiner to determine the associated attachment point and input field responsible for the object model not being correct.

In some embodiments, data input to the system using an input interface enters processing as an element value in an element value structure. The element value structure holds other information and/or metadata regarding the schema of the input interface and other attribute information for the element values. For example, the input interface collects a name, which includes a first name and a last name, and any alias names, which also include a first name and a last name for each. Further, a name or a first name or a last name has associated with it other information as part of the element value structure (e.g., maximum lengths, minimum lengths, required, optional, type, display indications—for example, vertical, horizontal, font, sizes, underlines, etc.).

In some embodiments, the element value structure is processed to build an instance of the model of the data that is to be entered in the database. The processing progresses through the element value structure but keeps track of where in the structure the processing is. The processing includes entering the element value into the instance of the model, and checking the element value using model level validations. The model level validations are associated with the model and run on the element values within the instance of the model of the data. In the event that the processing on an element value fails an associated validation, the path from the top level of the element value structure to the element value being processed along with an attachment point provide the needed information to indicate the location in the input interface associated with the failure. For example, an input interface includes an input field for an email address which is associated with an element value. Associated with the email address is an attachment point. The email attachment point has associated with it validation checks. As the element value is processed to become a part of a model that is to be saved, the updated model (as updated with the element value) is checked using model level validation checks. In the event that a validation check fails, the email attachment point and the information of where within the element value structure the processing was is used to provide the user with information to enable correcting the value that failed the check (e.g., so the input at the input interface can be corrected). In some embodiments, tracking is always taking place as to where in the processing of the element structure the processing is; When a model level validation fails, the tracking information and the attachment point information is used to enable the system to be able to tell a user the input field that is the source of the failed model level validation. In some embodiments, the tracking information is stored as a series of pointer locations in a stack structure. In some embodiments, the stack structure stores an element value structure location. In some embodiments, the tracking information of the locations is stored in the data processing module (e.g., a memory accessible in a data processing module during model building and during attachment point determination). For example, as the element value structure is traversed during processing, the locations are pushed onto a stack so that the location of an attachment point can be identified. This allows a user to be notified which input in which input interface needs to be adjusted to correct the validation failure. In addition, the user can be notified as to the nature of the failure so that the user can correct the validation failure.

In some embodiments, the attachment point is a tag that has a unique meaning (e.g., associated with email addresses or associated with a first name). There may be multiple places where email addresses are input via the input interface. The code for checking the email addresses can be reused for uniformity and efficiency. The location associated with a faulty input (e.g., an input that fails a model level validation) is uniquely identifiable using the attachment point and the place within the element value structure that is being processed.

In some embodiments, a model level validation is a validation that executes against a model and is tied to a definition of the structure of the model.

In some embodiments, only one attachment point is associated with an input field. In some embodiments, there are many attachment points on an input interface which has multiple input fields. In some embodiments, there are many different model level validations—for example, there are different validations that are executed against the model that are associated with one attachment point.

In some embodiments, maintaining object database correctness using only validations on input data (e.g., before building the object model) is difficult, due to the many different routes available for data to enter the database (e.g., through application programming interfaces, using a hypertext markup language (HTML) interface, using a Javascript™ object notation (JSON) interface, etc.) and the complexity of the model building transformation. In some embodiments, the use of validation at the model level as opposed to the input level enables reuse of code for efficiency of coding and uniformity of validation (e.g., the same validations are executed on the same type of input).

In some embodiments, attachment points are invariant entities whose meanings never change. Their locations within an element structure could change over time as the components of the element structure are refactored, added, or deleted. But, the associated model level validation of an attachment point is invariant. A model level validation associated with an attachment point can then be useful wherever an attachment point appears in the future, without re-work by application development, except to identify the attachment points in the new/refactored element structure. In some embodiments, input interfaces can change over time, and these changes can be done without affecting the model and the model level validations. The attachment point on the input interface may change, but its meaning and associated model level validation are the same. This makes the refactoring of input interfaces much easier.

In some embodiments, model level validations not specifically associated with attachment points can operate without further application development to always protect the model.

FIG. 1 is a block diagram illustrating an embodiment of a network system. In some embodiments, the network system of FIG. 1 comprises a system for an object-based database system. In some embodiments, the network system of FIG. 1 comprises a system for model level validation. In the example shown, FIG. 1 comprises network 100. In various embodiments, network 100 comprises one or more of the following: a local area network, a wide area network, a wired network, a wireless network, the Internet, an intranet, a storage area network, or any other appropriate communication network. Administrator system 102, user system 104, and object-based database system 106 communicate via network 100. In various embodiments, administrator system 102 comprises a system for an administrator to access and manage data on object-based database system 106. User system 104 comprises a system for a user. In some embodiments, user system 104 comprises a system for accessing object-based database system 106. Object-based database system 106 comprises a system for managing an object-based database. In some embodiments, object-based database system 106 comprises a system for storing data provided by a user (e.g., via user system 104 and network 100). In some embodiments, object-based database system 106 comprises a system for validating data provided by a user. In some embodiments, object-based database system 106 comprises a system for performing input validations. In some embodiments, object-based database system 106 comprises a system for performing model-level validations.

Figure 2:
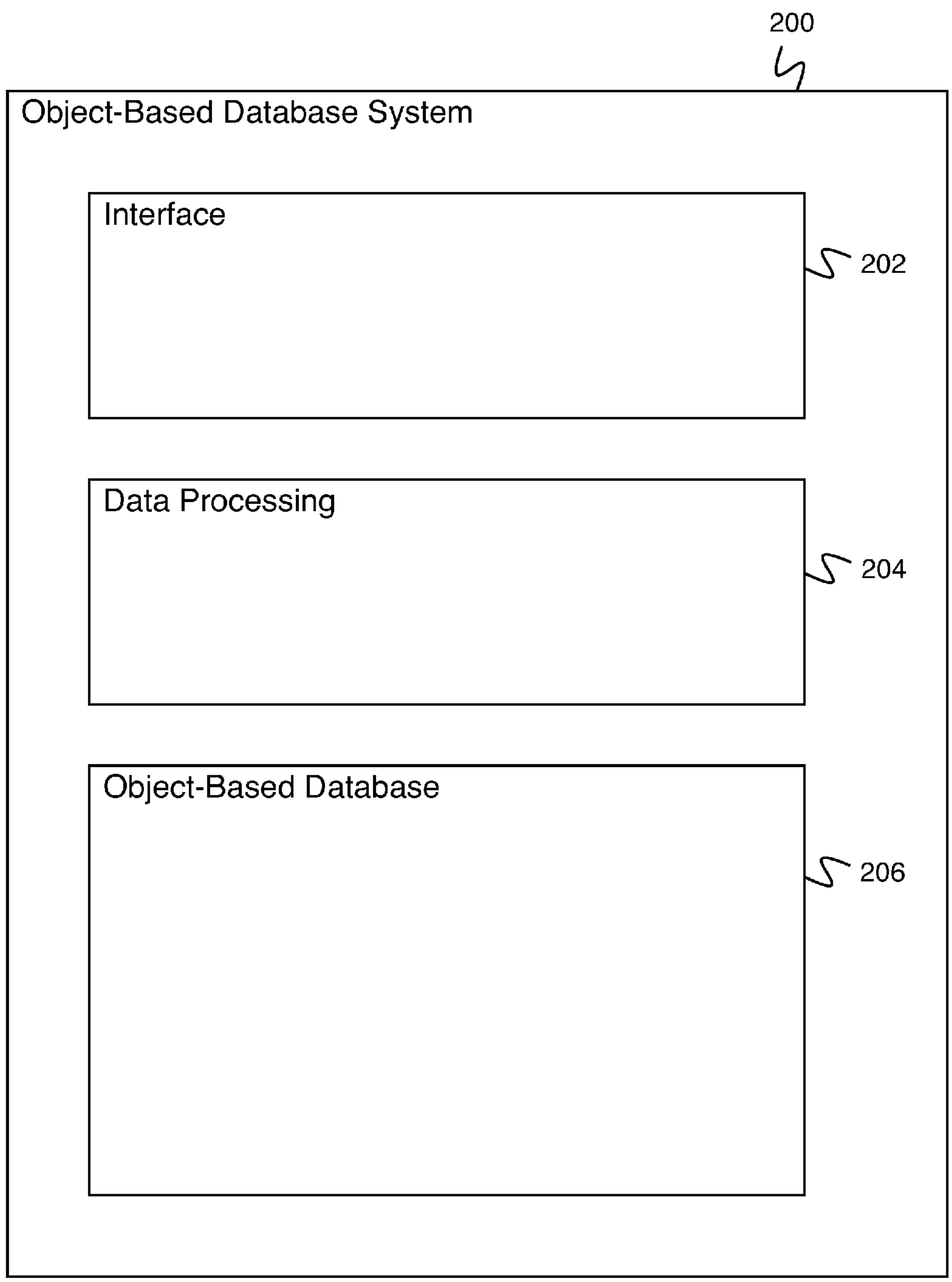
FIG. 2 is a block diagram illustrating an embodiment of an object-based database system.

FIG. 2 is a block diagram illustrating an embodiment of an object-based database system. In some embodiments, object-based database system 200 comprises object based database system 106 of FIG. 1. In the example shown, object-based database system 200 comprises interface 202. In various embodiments, interface 202 comprises an interface for providing user interface information to a user, receiving input data, providing input data to data processing 204, providing an attachment point to data processing 204, or performing any other appropriate interface function. Data processing 204 is a module for processing input data. In various embodiments, data processing 204 validates input data, builds an object model, validates an object model, commits an object model to object-based database 206, determines an attachment point, or performs any other appropriate data processing function. Object-based database 206 comprises an object-based database for storing data. In some embodiments, object-based database 206 comprises a set of objects, each object including object data, object methods, and interconnections (e.g., relationships) to other objects. In some embodiments, a validated object model created by data processing 204 is committed to object-based database 206.

Figure 3:
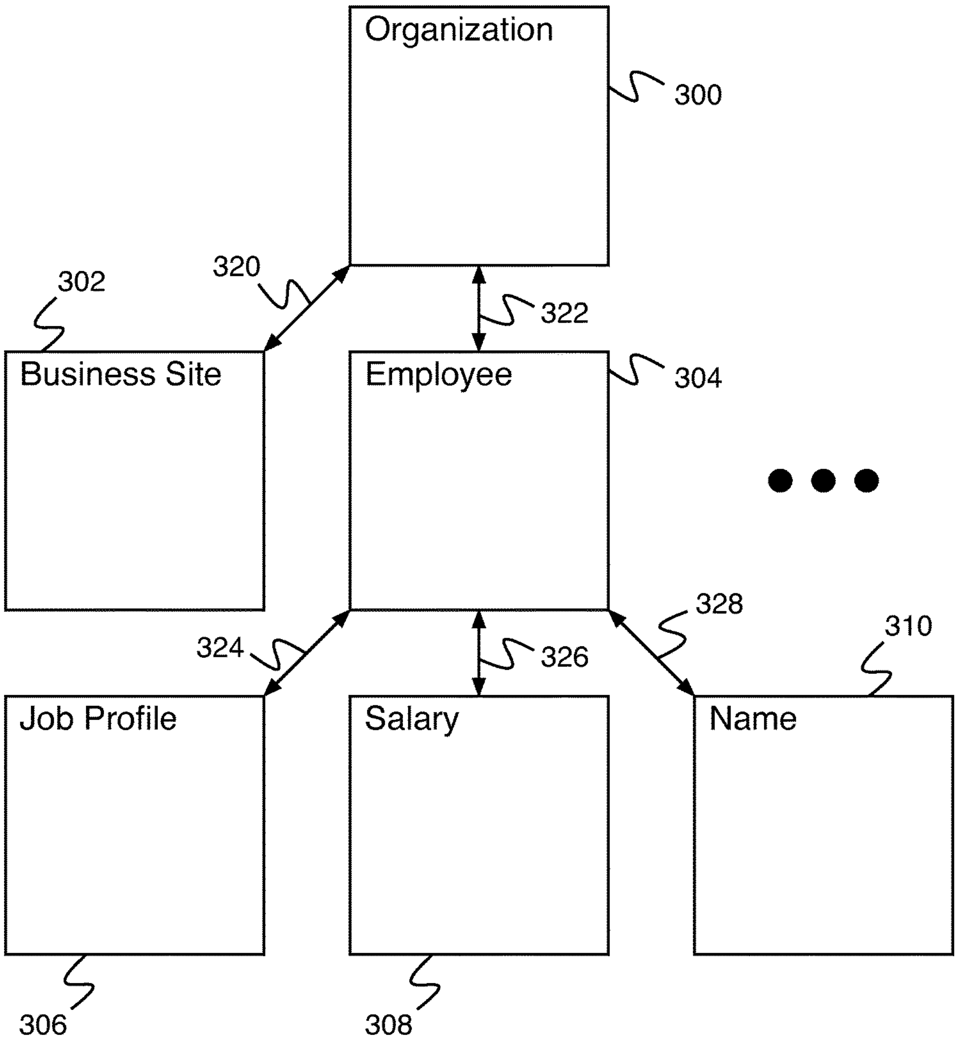
FIG. 3 is a diagram illustrating an embodiment of a data structure for an object tree.

FIG. 3 is a diagram illustrating an embodiment of a data structure for an object tree. In some embodiments, the object tree of FIG. 3 may comprise stored data in a database system (e.g., in object-based database 206 of FIG. 2). In some embodiments, objects 300, 302, 304, 306, 308, and 310 comprise instances of object data structures. In some embodiments, interconnections 320, 322, 324, 326, and 328 comprise relations (e.g., associations between objects). In the example shown, the object data structure instances of FIG. 3 describe part of a business data structure. Organization 300 has interconnection 320 to business site object instance 302. Business site object instance 302 contains the name of the site at which the organization resides. Organization 300 also has interconnection 322 to employee object instances including employee object instance 304, each representing an employee that is part of the organization. Employee object instance 304 has interconnection 324, interconnection 326, and interconnection 328 to job profile object instance 306, salary object instance 308, and name object instance 310, respectively. Job profile object instance 306 includes job profile attributes corresponding to employee 304. Salary object instance 308 includes salary attributes corresponding to employee 304. Name object instance 310 includes name attributes corresponding to employee 304. In this way, data can be stored in a way representing the organizational structure of the company. In some embodiments, programs can access and store attribute data by traversing the object tree along the interconnections between object instances, and operate on the stored attribute data to create a meaningful report about the organization. In various embodiments, one or more model level validations are associated with one or more objects in the model. An example of a model level validation as defined on the definition of an object comprises one or more of the following: an employee salary must fit within restrictions set on the associated job profile, business site, and/or organization for the employee; employees can only be hired or transferred into an organization when the organization currently has open positions or headcount to fill; employee personal information (demographic or biographic) types are only collected as appropriate for the location of the worker, determined by the organization for the worker and its associated business site (e.g., ethnicity, disabilities, place of birth, and military service/status, etc.), or any other appropriate example.

Figure 4:
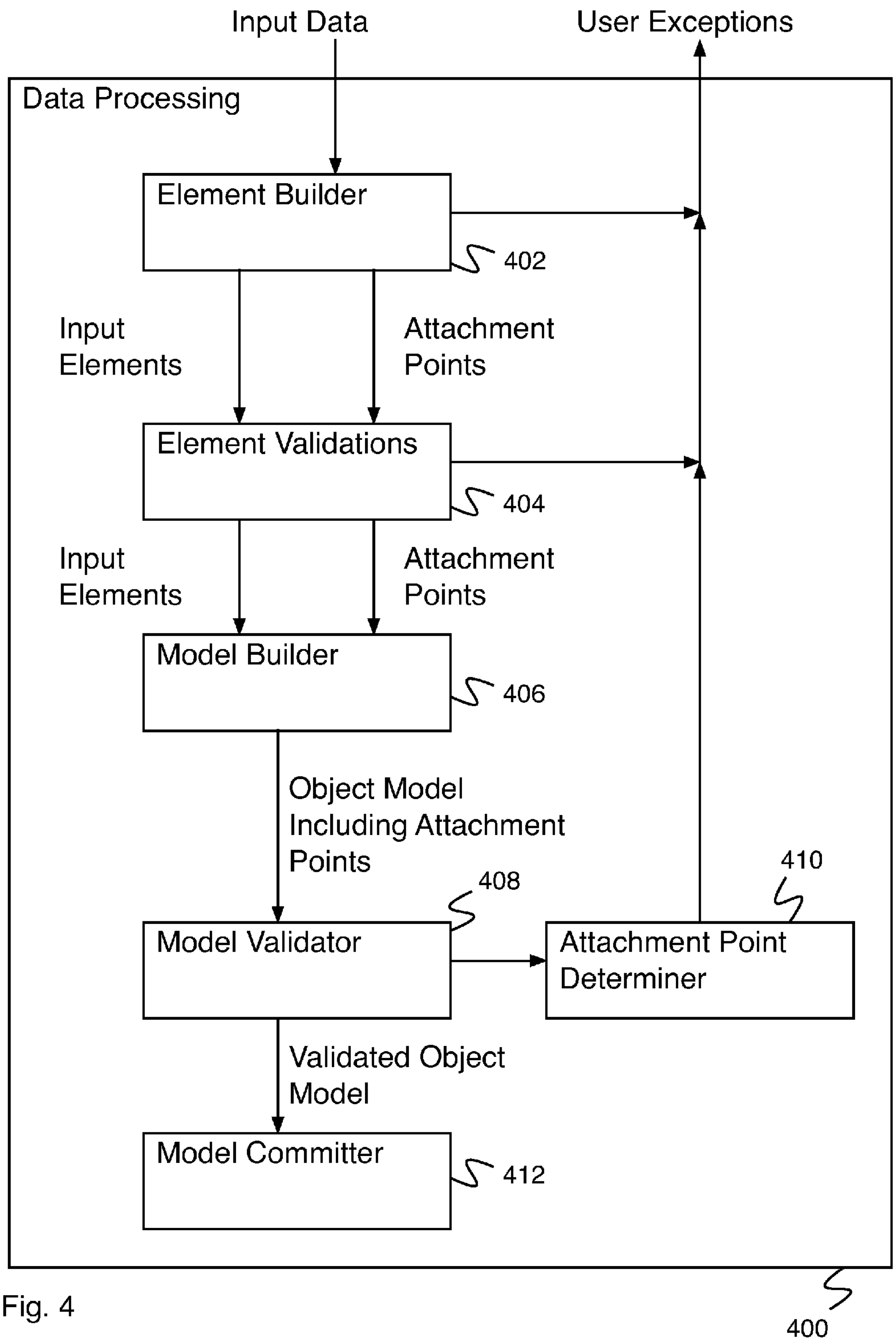
FIG. 4 is a block diagram illustrating an embodiment of a data processing.

FIG. 4 is a block diagram illustrating an embodiment of a data processing module. In some embodiments, data processing 400 comprises data processing 204 of FIG. 2. In the example shown, data processing 400 comprises a module that receives input data (e.g., received via a user interface (e.g., interface 202 in FIG. 2) and processes the input data. Element builder 402 receives data input to data processing 400. In some embodiments, element builder 402 performs low-level security checks on input data. In some embodiments, in the event a low-level security check performed by element builder 402 indicates inappropriate data or lack of data, an error message is provided to a user. In some embodiments, element builder 402 determines an attachment point associated with received input data. In various embodiments, element builder 402 determines the attachment point by querying a user interface object, by querying an attachment point table, or in any other appropriate way. Element builder 402 builds a set of elements comprising the data and attachment points. In some embodiments, elements comprise structured data that can be efficiently built into an object model. In some embodiments, the location in the element structure and the attachment points enable the system to determine correspondence between an input and its location in the model. In some embodiments, element builder 402 is implemented using a processor. Element validations 404 performs model level validation on the elements. In various embodiments, a model level validation comprises checking element data values, element data ranges, element data types, element data consistency, or any other appropriate element characteristics. In some embodiments, in the event an element validation indicates an invalid element, a user exception is provided to a user. In some embodiments, in the event an element validation does not indicate an invalid element, elements and attachment points are provided to model builder 406. In some embodiments, element validations 404 is implemented using a processor. Model builder 406 comprises a module for building a model. In some embodiments, model builder 406 builds an object model from a set of elements. In some embodiments, an object model comprises a set of objects including object data and interconnections between objects. In some embodiments, an object model includes temporary connections to objects in an object-based database. In some embodiments, attachment points received by model builder 406 are incorporated into the model. In some embodiments, attachment points are associated with one or more objects. In some embodiments, attachment points are associated with one or more object data fields.

In some embodiments, the object model (e.g., including attachment points) is provided to model validator 408. In some embodiments, model builder 406 is implemented using a processor. Model validator 408 comprises a module for determining whether an object model is valid. In some embodiments, model validator 408 is for determining whether an object model is valid in an object-based database (e.g., before committing it to the database). In some embodiments, model validator 408 validates objects of the object model and interconnections between objects in the object model. In some embodiments, model validator 408 validates temporary connections from objects in the object model to objects in an object-based database. In some embodiments, model validator 408 validates an object of the object model using information associated with other objects of the object model—for example, the information for validation is associated with two or more different objects. In some embodiments, model validator 408 validates an object of the object model that is associated with an input interface or input field using information associated with another input interface or another input field—for example, the information is associated with two or more input interfaces and/or two or more input fields.

In some embodiments, in the event model validator 408 determines the model is not valid, model validator 408 provides invalidity information to attachment point determiner 410. In various embodiments, invalidity information comprises the object model, an indication of an invalid data field, an indication of an invalid interconnection, an indication of inconsistent data, or any other appropriate invalidity information. In some embodiments, in the event model validator 408 determines the model is not valid, temporary connections to the database are deleted. In some embodiments, in the event model validator 408 determines the model is valid, model validator 408 provides a validated object model to model committer 412. In some embodiments, model validator 408 is implemented using a processor. Attachment point determiner 410 comprises an attachment point determiner for determining an attachment point. In some embodiments, attachment point determiner 410 determines an attachment point from invalidity information. In some embodiments attachment point determiner 410 determines an attachment point from an object model and an indication of an object model invalidity. In some embodiments, determining an attachment point comprises determining an input field associated with invalid data. In some embodiments, attachment point determiner 410 provides the attachment point as an error message to a user. In some embodiments, attachment point determiner 410 provides an error message to a user indicating a validation failure and also indicating an associated input field of an input interface. In some embodiments, attachment point determiner 410 provides the attachment point to an attachment point interpreter for interpreting and providing an associated exception to a user. In some embodiments, attachment point determiner 410 determines more than one attachment point. In some embodiments, attachment point determiner 410 is implemented using a processor.

In the example shown, model committer 412 comprises a module for committing a model. In some embodiments, model committer 412 commits a validated object model to a database. In some embodiments, committing a model comprises storing the model in an object-based database. In some embodiments, committing a model comprises changing temporary connections into permanent interconnections. In some embodiments, a committed model can be accessed (e.g., by a user) and data associated with the committed model can be retrieved. In some embodiments, a committed model becomes part of an audit trail (e.g., the commit is recorded permanently to an audit trail and undoing the commit requires adding a further recording to the audit trail). In some embodiments, model committer 412 is implemented using a processor. In various embodiments, the elements of data processing 400 are each implemented using separate processors, are all implemented on a single processor, or are combined onto one or more processors in any other appropriate way.

In some embodiments, examples of model level validations are as follows: for a payroll earning and deduction setup, there are many validation checks required. With model level validations, the validation is coded once and can be up taken easily by both user interface tasks and web service tasks. For example:

A data ranges check:

Payroll code length: the deduction code plus payroll tax authority code must not be more than 15 characters in length. Error message should indicate to shorten either deduction code or payroll tax authority code to be within 15 characters in length;

A data value check:

Payroll code value: The code for a United Kingdom payroll statutory deduction must begin with "W_GBR";

A data consistency check:

Earning compensation mapping: An earning is mapped to a compensation element and is required to retrieve value(s) from the compensation element. This is a cross validation between many fields on the earning setup. When an earning is associated with a compensation element, the earning must use a calculation to retrieve its value;

A data ranges check:

Earning gross-up type: The country on the earning definition is required to match the country from the gross-up type. Certain gross-up types are available only for certain countries;

An element data types check:

Public metadata calculation: In a company product, classes have a class specification of Audited (customer data), Metadata (service provider company data), or Mixed (can be audited or metadata). Within a payroll calculator, the service provider company uses a calculation engine which is "Mixed". Prior to commit, it is very difficult to tell whether data produced by the payroll calculator is Audited or Metadata. Post commit it is simple. With model level validation, it is simple. The validation checks to see whether the data is a "Metadata" calculation instance. The data is also checked to see whether the data is public (e.g., whether the calculation can be used by customers). In the event that the metadata calculation can be seen by customers, the system ensures it has a "comment" on it.

Figure 5:
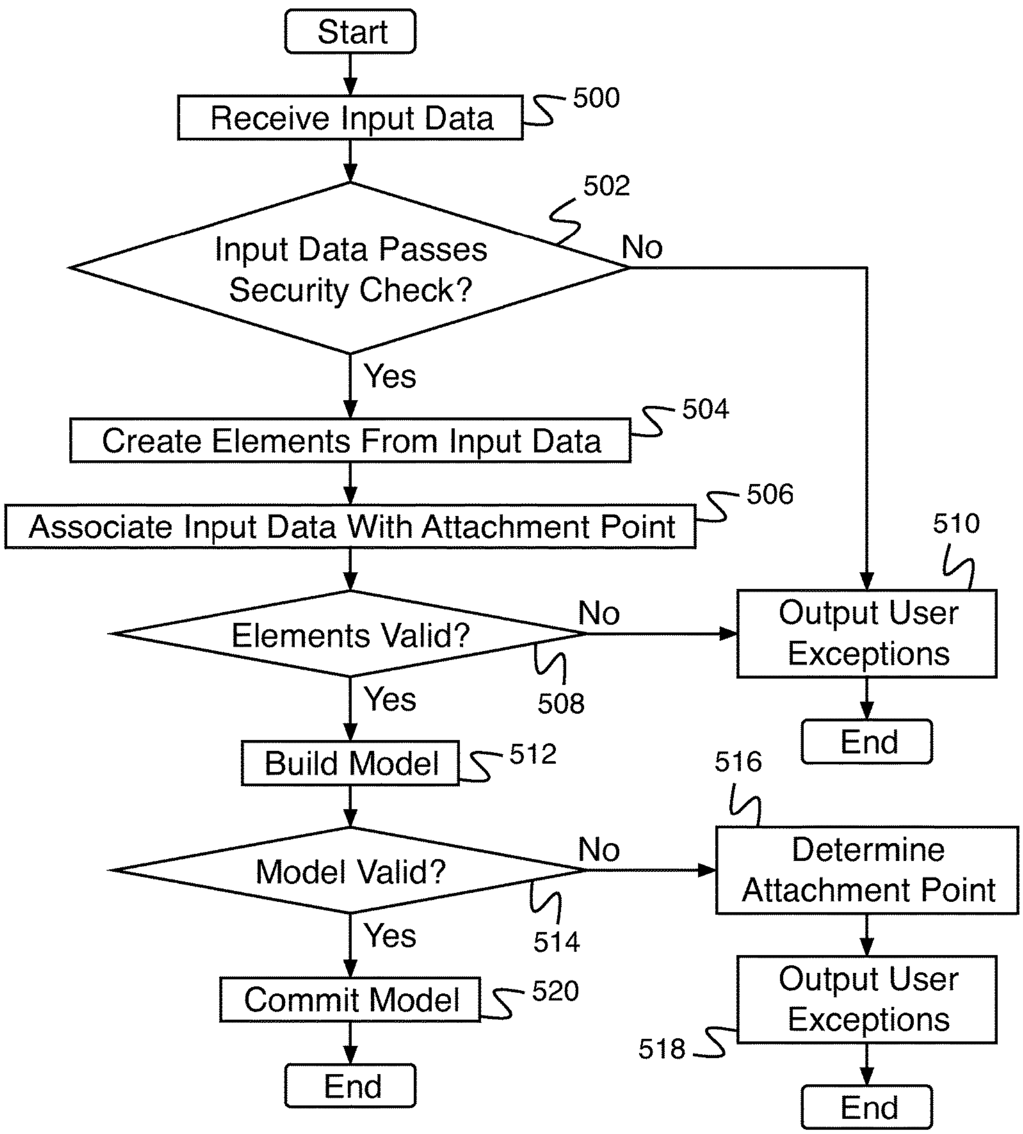
FIG. 5 is a flow diagram illustrating an embodiment of a process for a data processing.

FIG. 5 is a flow diagram illustrating an embodiment of a process for a data processing. In some embodiments, the flow diagram of FIG. 5 comprises a process for data processing 400 of FIG. 4. In the example shown, in 500, input data is received. In some embodiments, input data is received from a user interface (e.g., interface 202 of FIG. 2). In 502, it is determined whether the input data passes a security check. In the event it is determined that the input data does not pass the security check, control passes to 510. In the event it is determined that the input data passes the security check, control passes to 504. In 504, elements are created from input data. In 506, input data is associated with an attachment point. In some embodiments, the attachment point is determined from a user interface element. In some embodiments, 506 is performed prior to 504. In 508, it is determined whether the elements are valid. In the event it is determined that the elements are not valid, control passes to 510. In the event it is determined that the elements are valid, control passes to 512. In 510, user exceptions are output, and the process ends. In some embodiments, user exceptions comprise indications to a user that invalid data was entered. In 512, a model is built. In some embodiments, a model comprises an object model built from elements. In 514, it is determined whether the model is valid. In the event it is determined that the model is not valid, control passes to 516. In the event it is determined that the model is valid, control passes to 520. In 516, an attachment point is determined. In some embodiments, an attachment point corresponding to invalid data is determined. In some embodiments, more than one attachment point is determined. In 518, user exceptions are output, and the process ends. In some embodiments, user exceptions are determined from the attachment point. In 520, the model is committed.

Figure 6:
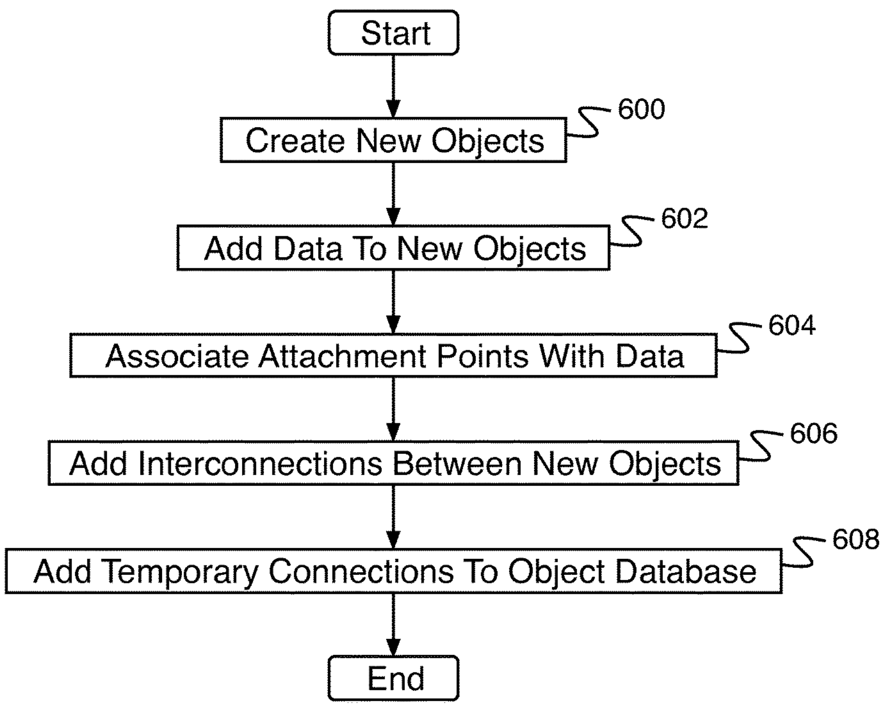
FIG. 6 is a flow diagram illustrating an embodiment of a process for building a model.

FIG. 6 is a flow diagram illustrating an embodiment of a process for building a model. In some embodiments, the process of FIG. 6 implements 512 of FIG. 5. In the example shown, new objects are created. In 602, data is added to the new objects. For example, element values from the element value structure are added to the new objects as appropriate. In 604, attachment points are associated with the data. For example, attachment points as indicated in metadata information associated with the element value structure are associated with the data added to the new objects. In 606, interconnections are added between the new objects. In 608, temporary connections to an object database are added. For example, temporary connections that are to be made permanent when the new objects and their interconnections are committed to the database.

Figure 7:
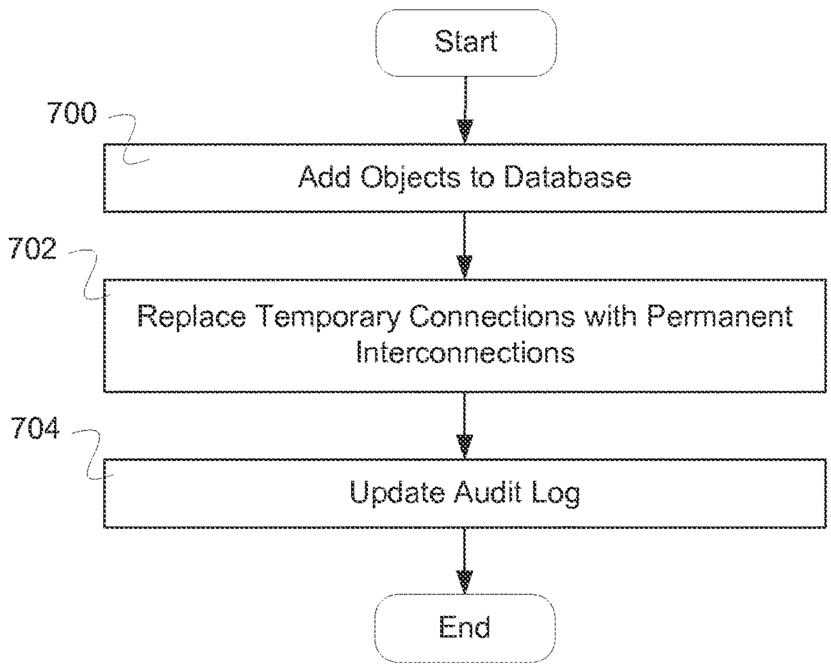
FIG. 7 is a flow diagram illustrating an embodiment of a process for committing a model.

FIG. 7 is a flow diagram illustrating an embodiment of a process for committing a model. In some embodiments, the process of FIG. 7 implements 520 of FIG. 5. In the example shown, in 700, the model is added to the database. In some embodiments, adding the model to the database comprises storing the model in the database. In 702, temporary connections (e.g., connections from the model to objects already in the database) are replaced with permanent interconnections. In 704, the audit log is updated (e.g., indicating the changes to the database).

In some embodiments, example use cases comprise multiple validations that are required for different wrappers (e.g., an email example, a Canadian reference number criteria assignment example, etc.). In some embodiments, example use cases demonstrating the problem of the multiple validations (e.g., why required, what differences are, etc.) are provided below and how the exception implementation simplifies the checking:

Email Example:

All email addresses entered into the system should be validated against the pattern defined in Request for Comments publication of the Internet Engineering Task Force RFC5332. A comprehensive system models the storage of Internet email addresses as a single class, linked and reused in all cases where an email address is required.

Without a model driven approach to validating email address, each element containing email address must be validated as the data is entered into the system. Due to varied nature of the ways that email address may be entered, this leads to a large number of repeated validation methods. Additionally the number of validation methods grows as more email address uses are added to the system. Examples:

1. Email address for a recruiting candidate
2. Email address for an employee
3. Email address associated with a business site, organization, or other entity
4. Email address associated with an external entity for an employee (for example an external email system or cloud storage)
5. Email address associated with a government entities (examples: form I-9 in the United States, Déclaration sociale nominative in France)

Model Validation Approach

Description: A single model validation can be written for an Internet Email class that validates the email against RFC5332 in all cases to protect the model by validating the state of the model. This ensures that all email addresses are always valid in the system, regardless of the data entry point.

Attachment Points: For each element where email address can be entered.

Canadian Reference Number Criteria Assignment

In this example, an "overlapping date range check" has to be coded differently between the User Interface (UI) task and the web service task. A table of rows exists with start and end date columns. Between rows, the start and end dates cannot overlap. Within the UI task named Edit Company Federal CAN Tax Reporting, all rows of the Canadian Reference Number Criteria Assignment are available in the element. To check for an overlapping date range between rows, the rows are retrieved from the element itself. Within a web service task, typically each row is processed independently, which limits the availability of data during a processing step. To check for overlapping date check, the current row in the element must be checked against persisted rows. The validation for the web service must be coded differently than the UI validation. When using model level validations, the validation can be coded once and used for both the UI task and web service task. This greatly simplifies the creation and maintenance of the validation.

In some embodiments, validations may not pick up problems (e.g., payroll calculation engine validation, bulk loading data, etc.). The examples below illustrate how validations may not pick up problem, but during post processing just prior to commitment, the problem can be spotted and caught by model level validation checking:

Payroll Calculation Engine Validation

Validation: A comment is required for a "public" metadata calculation.

In a company product, classes have a class specification of Audited (customer data), Metadata (company data), or Mixed (can be audited or metadata). Within a payroll calculator, the company uses a calculation engine which is "Mixed". Prior to commit, it is very difficult to tell whether data produced by the payroll calculator is Audited or Metadata. Post commit it is simple. With model level validation, it is simple. The validation checks to see whether the data is a "Metadata" calculation instance. The data is also checked to see whether the data is public (e.g., whether the calculation can be used by customers). In the event that the metadata calculation can be seen by customers, the system ensures it has a "comment" on it.

Bulk Loading Data

In cases where data is bulk loaded, performing comprehensive validation on individual pieces of data in the input interface is sometimes quite difficult or impossible because data may include validation dependencies that cannot be fully resolved until all processing is complete. Cases such as these can be handled easily by performing validations after processing on the final model. Examples:

1. When multiple new hire employees are loaded in a single request (common for web services), validation regarding open headcount are unresolvable until after processing. During processing, the system typically is able to determine and resolve duplicate hires (combining them into a single hire as necessary), as well as determine the correct organization(s), job(s), job profile(s), etc. This is further complicated in that a large system may allow multiple simultaneous requests to be accepted. In these cases, model level validation after processing is complete provides a single and consistent way to validate the data.
2. Certain pieces of data that can be entered during a hire may depend upon already persisted data, and requires processing to determine the correct validation to apply. Many pieces of data are only valid for certain locations, as determined from the business site for the hired employee. This may not be fully resolvable until after the processing of the hire is complete. Examples where collecting certain types of data is restricted to specific work locations include citizenship, nationality, pre-hire medical exams, and hukou type.

In some embodiments, the model level validation is selective (e.g., not always on):

FLSA Period: On an Earning Setup, a FLSA Period is only supported by USA Earning. Each earning definition is associated with a country. A FLSA Period is only supported in the event that the earning is associated with USA. This validation is checked at save time for the earning.

Pay Component Group: On an earning setup, the pay component group field contains mutually exclusive values, "Quebec Bonus Earnings—Regular" & "Quebec Income Taxable (Withhold Taxes)". One of these values must be removed. On each earning definition, users associate Pay Component Groups with the earning. Only certain combinations of Pay Component Groups are valid per earning. This validation makes sure that the two Pay Component Groups listed are not together for the same earning. This validation will be checked when saving the earning definition.

Job Overlap: In most cases, a position should only be filled by a single employee at any given time. In cases where there is an overlap in filling a job (e.g., when a new employee is being trained by the outgoing employee), it is desirable to selectively turn off the validation enforcing a single employee in the position for a limited time. For Job overlap, the selection of whether or not to apply the validation on "1 employee for a job" is based on a setting on the job object or possibly a higher grouping (e.g., job profile, organization, company, etc.). To enable job overlapping, a setting that says "allow job overlap" exists as a condition for the model validation. When the condition is true, the validation that ensures the only one person in a job rule is relaxed so that it is now allowed for more than one person to fill the job at a given time.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for model validation, comprising:
a processor; and
a memory coupled with the processor, wherein the memory is configured to provide the processor with instructions which when executed cause the processor to:
receive, via two or more different input interfaces, a set of input data, wherein a first input data of the set of input data is associated with a first model level validation and a first attachment point, and a second input data of the set of input data is associated with a second model level validation and a second attachment point, wherein the first attachment point is associated with the first input data input using a first input field, wherein the second attachment point is associated with the second input data input using a second input field, the first input field being different from the second input field, wherein the first attachment point includes a first identifier uniquely identifying the first input field, wherein the second attachment point includes a second identifier uniquely identifying the second input field, wherein the first input data is input via a first input interface, and wherein the second input data is input via a second input interface, the two or more different input interfaces including the first input interface and the second input interface, the first input interface and the second input interface each being associated with a single attachment point, wherein the receiving of the set of input data comprises to:
create elements based on the set of input data, and
associate the set of input points with attachment points;
determine a model that is used to update a database based at least in part on the set of input data, comprises to:
build a model based on the created elements;
determine whether the model is valid using model validations, wherein the determining of whether the model is valid is performed after the receiving of the set of input data, and wherein the model validations include the first model level validation and the second model level validation, wherein the determining of whether the model is valid comprises to check the validity of the elements, and wherein the determining of whether the model is valid comprises to:
perform a validation check on the first input data and the second input data for validity; and
in response to a determination that at least one of the first input data or the second input data is not valid, determine that the model is not valid;
commit the model in response to a determination the model is valid; and
determine a failure associated attachment point in response to a determination the model is not valid, wherein the failure associated attachment point comprises the first attachment point in response to a determination that the first model level validation failed, and wherein the failure associated attachment point comprises the second attachment point in response to a determination that the second model level validation failed.

2. The system of claim 1, wherein the processor is further configured to provide an error message to a user.

3. The system of claim 1, wherein the determining of the failure associated attachment point comprises to determine a failure associated input field.

4. The system of claim 3, wherein an error message provided to a user comprises the failure associated input field.

5. The system of claim 1, wherein the committing of the model comprises to store the model in the database.

6. The system of claim 1, wherein the model comprises temporary connections to the database.

7. The system of claim 6, wherein in response to a determination the model is not valid, the temporary connections to the database are deleted.

8. The system of claim 6, wherein in response to a determination the model is valid, the temporary connections to the database are converted into permanent interconnections.

9. The system of claim 1, wherein the model comprises the set of input data.

10. The system of claim 1, wherein the model comprises the first attachment point.

11. The system of claim 1, wherein the determining of whether the model is valid using model validations comprises to determine whether the model is valid using information associated with two or more different objects.

12. The system of claim 1, wherein the determining of whether the model is valid using model validations comprises to determine whether the model is valid using information associated with the two or more different input interfaces.

13. The system of claim 1, wherein the determining of whether the model is valid using model validations comprises to determine whether the model is valid using information associated with two or more different fields.

14. The system of claim 1, wherein a model validation of the model validations is selectively on.

15. The system of claim 1, wherein determining whether the model is valid using model validations comprises one or more of the following: checking a data value, checking a data range, checking a data type, and checking a data consistency.

16. A method for model validation, comprising:

receiving, via two or more different input interfaces, a set of input data, wherein a first input data of the set of input data is associated with a first model level validation and a first attachment point, and a second input data of the set of input data is associated with a second model level validation and a second attachment point, wherein the first attachment point is associated with the first input data input using a first input field, wherein the second attachment point is associated with the second input data input using a second input field, the first input field being different from the second input field, wherein the first attachment point includes a first identifier uniquely identifying the first input field, wherein the second attachment point includes a second identifier uniquely identifying the second input field, wherein the first input data is input via a first input interface, and wherein the second input data is input via a second input interface, the two or more different input interfaces including the first input interface and the second input interface, the first input interface and the second input interface each being associated with a single attachment point, wherein the receiving of the set of input data comprises:

creating elements based on the set of input data, and associating the set of input points with attachment points;

determining, using a processor, a model that is used to update a database based at least in part on the set of input data, comprises:

building a model based on the created elements;

determining whether the model is valid using model level validations, wherein the model validations include the first model level validation and the second model level validation, wherein the determining of whether the model is valid is performed after the receiving of the set of input data, wherein the determining of whether the model is valid comprises checking the validity of the elements, and wherein the determining of whether the model is valid comprises:

performing a validation check on the first input data and the second input data for validity; and in response to a determination that at least one of the first input data or the second input data is not valid, determining that the model is not valid;

committing the model in response to a determination the model is valid; and determining a failure associated attachment point in response to a determination the model is not valid, wherein the failure associated attachment point comprises the first attachment point in response to a determination that the first model level validation failed, and wherein the failure associated attachment point comprises the second attachment point in response to a determination that the second model level validation failed.

17. A computer program product for model validation, the computer program product being embodied in a non-transitory computer readable storage medium and comprising computer instructions for:

receiving, via two or more different input interfaces, a set of input data, wherein a first input data of the set of input data is associated with a first model level validation and a first attachment point, and a second input data of the set of input data is associated with a second model level validation and a second attachment point, wherein the first attachment point is associated with the first input data input using a first input field, wherein the second attachment point is associated with the second input data input using a second input field, the first input field being different from the second input field, wherein the first attachment point includes a first identifier uniquely identifying the first input field, wherein the second attachment point includes a second identifier uniquely identifying the second input field, wherein the first input data is input via a first input interface, and wherein the second input data is input via a second input interface, the two or more different input interfaces including the first input interface and the second input interface, the first input interface and the second input interface each being associated with a single attachment point, wherein the receiving of the set of input data comprises:

creating elements based on the set of input data, and associating the set of input points with attachment points;

determining, using a processor, a model that is used to update a database based at least in part on the set of input data, comprises:

building a model based on the created elements;

determining whether the model is valid using model level validations, wherein the model validations include the first model level validation and the second model level validation, wherein the determining of whether the model is valid is performed after the receiving of the set of input data, wherein the determining of whether the model is valid comprises checking the validity of the elements, and wherein the determining of whether the model is valid comprises:

performing a validation check on the first input data and the second input data for validity; and in response to a determination that at least one of the first input data or the second input data is not valid, determining that the model is not valid;

committing the model in response to a determination the model is valid; and determining a failure associated attachment point in response to a determination the model is not valid, wherein the failure associated attachment point comprises the first attachment point in response to a determination that the first model level validation failed, and wherein the failure associated attachment point comprises the second attachment point in response to a determination that the second model level validation failed.

18. The system of claim 1, wherein:

the first input data includes a first email address; and the second input data includes a second email address.

* * * * *